(12) United States Patent
Huang et al.

(10) Patent No.: US 6,850,089 B2
(45) Date of Patent: Feb. 1, 2005

(54) APPARATUS FOR CAPACITOR-COUPLING ACCELERATION

(75) Inventors: Hong-Yi Huang, Taipei (TW); Shih-Lun Chen, Taipei (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 10/340,760

(22) Filed: Jan. 13, 2003

(65) Prior Publication Data

US 2003/0184337 A1 Oct. 2, 2003

(30) Foreign Application Priority Data

Mar. 27, 2002 (TW) ........................................ 91106057 A

(51) Int. Cl.[7] .............................................. H03K 19/092
(52) U.S. Cl. ............................. 326/26; 326/21; 326/27; 326/86; 326/83; 326/88; 327/170; 327/112; 327/333
(58) Field of Search .............................. 326/21, 26, 27, 326/30, 83, 86, 88, 90; 327/170, 112, 333, 404, 379, 563

(56) References Cited

U.S. PATENT DOCUMENTS

| | | | | | |
|---|---|---|---|---|---|
| 4,504,747 | A | * | 3/1985 | Smith et al. | .................. 326/70 |
| 5,491,428 | A | * | 2/1996 | Pan | ............................. 326/17 |
| 5,898,326 | A | * | 4/1999 | Okayasu | ..................... 327/112 |
| 5,995,735 | A | | 11/1999 | Le | |
| 6,009,253 | A | | 12/1999 | Srivatsa et al. | |
| 6,043,675 | A | * | 3/2000 | Miyamoto | ................... 326/36 |
| 6,313,677 | B1 | * | 11/2001 | Okayasu | ..................... 327/170 |

FOREIGN PATENT DOCUMENTS

TW 300355 7/1985

OTHER PUBLICATIONS

Yanbin Jiang, Sachin S. Sapatnker, Cyrus Bamji, and Juho Kim, "Interleaving buffer insertion and transistor sizing into a single optimization", IEEE Transactions on VLSI systems, vol. 6, No. 4, pp. 625–663, Dec. 1998.

Tmofumi Iima, Masayuki Mizuno, Tadahiko Horiuchi, and Masakazu Yamashina, "Capacitor Coupling Immune, Transient Sensitive Accelerator for Resistive Interconnect Signals of Subquarter Micron ULSI", IEEE Journal of Solid–State Circuits, vol. 31, pp. 531–536, Apr. 1996.

H. Zhang, V. George and J. M. Rabaey, "Low–Swing On–Chip Signaling Techniques: Effectiveness and Robustness", IEEE Transactions on VLSI Systems, vol. 8, No. 3, pp. 264–272, Jun. 2000.

Takayuki Kawahara, Masashi Horiguchi, Jun Etoh, Tomonori Sekiguchi, katsutaka Kimura, and Masakazu Aoki, "Low–power chip interconnection by dynamic termination", IEEE Journal of Solid–State Circuits, vol. 30, No. 9, Sep. 1995.

C. K. Kwon, K. M. Rho, and K. Lee, "High Speed and low Swing Interface Circuits Using Dynamic Over–Driving and Adaptive Sensing Scheme", IEEE International Conference on VLSI and CAD, pp. 388–391, 1999.

* cited by examiner

Primary Examiner—Vibol Tan
(74) Attorney, Agent, or Firm—Rabin & Berdo, P.C.

(57) ABSTRACT

A capacitor-coupling acceleration apparatus is an accelerating circuit capable of being applied to interconnect lines in an integrated circuit in order to reduce delay owing to parasitic resistance and capacitance of the interconnect lines in the integrated circuit. The apparatus can be disposed between the interconnect lines. When a signal transmitted on the interconnect line has a change from a low-level voltage to a high-level voltage, the apparatus detects the voltage level change of the signal and provides a charging loop to charge the interconnect line, thereby accelerating the change from the low-level voltage to the high-level voltage. When a signal on the interconnect line has a change from the high-level voltage to the low-level voltage, the apparatus detects the voltage level change of the signal and provides a discharging loop to discharge the interconnect line, thereby accelerating the change from the high-level voltage to the low-level voltage.

33 Claims, 11 Drawing Sheets

APPARATUS FOR CAPACITOR-COUPLING ACCELERATION

This application claims the benefit of Taiwan application Serial No. 091106057, filed Mar. 27, 2002.

BACKGROUND OF THE INVENTION

1. Field of the Invention

The invention relates in general to a capacitor-coupling device, and more particularly to a capacitor-coupling accelerator for use in an integrated circuit.

2. Description of the Related Art

In modem integrated circuit design, the delays of interconnect lines in a chip determine the performance of the whole chip. For the progress of the VLSI manufacturing process and the need for system-on-chip (SOC) integration, the gate delays in a chip are reduced when the devices in the chip are scaled down. Unfortunately, interconnect lines are lengthened along with the chip when the chip becomes larger. Besides, interconnect delays are made larger because greater RC effects result from the smaller line width of the interconnect lines and the narrower space between the interconnect lines. The performance of the whole chip would thus be degraded. As a result, the reduction in the interconnect delay is desired to be achieved.

The delay of an interconnect line can be reduced by inserting a buffer into the middle of the interconnect line because the delay time is proportional to the square of the interconnect length, as indicated by the relationship: $t \propto rcl^2$. This approach to reduction of the interconnect delay is illustrated in FIG. 1, wherein a buffer is inserted in the middle of the interconnect line. Suppose that the whole interconnect line has a delay time $\tau_{2\ mm}$ when its length is 2 mm originally. The delay time becomes $2 \times \tau_{1\ mm} + \tau_{buffer}$ when the buffer is inserted into the middle of the interconnect line, where $\tau_{1\ mm}$ is the interconnect delay for one segment of the interconnect line with a length of 1 mm and $\tau_{buffer}$ is the delay of the buffer. The delay time may thus reduced if $\tau_{2\ mm} > 2 \times \tau_{1\ mm} + \tau_{buffer}$. This approach is commonly used in the industry. The details for the approach is discussed in the literature by Yanbin Jiang, Sachin S. Sapatnekar, Cyrus Bamji, and Juho Kim, entitled "Interleaving buffer insertion and transistor sizing into a single optimization", IEEE Transactions on VLSI systems, vol. 6, no. 4, pp. 625–63, December 1998.

The interconnect delay can also be minimized by using a reduced voltage signal (V), as indicated by the equation t=CV/I deduced from Q=CV=It. This approach is disclosed in the literature by H. Zhang, V. Gerorge and J. M. Rabaey, entitled "Low-Swing On-Chip Signaling Techniques: Effectiveness and Robustness", IEEE Transactions on VLSI Systems, vol. 8, no. 3, pp. 264–272, June, 2000. The delay is reduced in this approach by first reducing the amplitude of a signal to be transferred at the sending end and then amplifying the received signal at the receiving end to make this signal have the original amplitude at the sending end. This approach requires a number of control signals or power supplies, thus resulting in difficulties in implementation. Thus, the approach is not suitable for mass production.

In addition, the transient sensitivity of the resistive interconnect signals can be accelerated by controlling the output stage according to a fast control signal and a slow control signal that are produced by a Schmitt trigger and a transient sensitive trigger (TST). This approach is disclosed by Tmofumi lima, Masayuki Mizuno, Tadahiko Horiuchi, and Masakazu Yamashina in the literature entitled "Capacitor coupling Immune, Transient Sensitive Accelerator for Resistive Interconnect Signals of Subquarter Micron ULSI", IEEE Journal of Solid-State Circuits, vol. 31, pp. 531–536, April 1996. Unfortunately, this approach has a disadvantage that the speed of discharging and charging processes involved in the output stage is reduced because the loops for discharging and charging are in serial connection with two PMOS and NMOS, respectively. The accelerating effect is thus restricted.

As discussed above, the conventional approaches to the reduction of the interconnect delay are difficult to control and have limited performance. Hence, it is desirable to provide an accelerating circuit that is of high performance and readily to be controlled so as to achieve the reduction in interconnect delay as well as to enhance the overall performance of the chip.

SUMMARY OF THE INVENTION

It is therefore an object of the invention to provide an apparatus for capacitor-coupling acceleration in order to reduce the time delay of the signal transmitted on the interconnect line and accelerate changes of the signal on the interconnect line.

The invention achieves the above-identified object by providing an apparatus for capacitor-coupling acceleration. The apparatus can be disposed in an interconnect line so as to reduce its interconnect delay and speed up the level change of a signal transmitted on the interconnect line. The apparatus includes a voltage step-down detecting device, a first capacitor, a discharging device, a voltage step-down charging device, accelerating devices, a voltage step-up detecting device, a second capacitor, a charging device, a voltage step-up discharging device. When the signal on the interconnect line decreases, the voltage step-down detecting device feeds a step-down signal to the first capacitor. The first capacitor passes the step-down signal to the voltage step-down charging device through the capacitor-coupling effect. The voltage step-down charging device then charges the discharging device so that the discharging device discharges the interconnect line, thereby accelerating the decrease of the signal transmitted on the interconnect line. In addition, one accelerating device can be coupled to the voltage step-down charging device and the discharging device to make the transition from high to low more rapid. When the signal on the interconnect line increases, the voltage step-up detecting device feeds a step-up signal to the second capacitor. The second capacitor passes the step-up signal to the voltage step-up discharging device through the capacitor-coupling effect. The voltage step-up discharging device then discharges the charging device so that the charging device charges the interconnect line, thereby accelerating the increase of the signal transmitted on the interconnect line. In addition, another accelerating device can be coupled to the voltage step-up discharging device and the charging device to make the transition from low to high more rapid.

Further, a high-threshold triggering device can be coupled to the interconnect line so as to output a control signal, which is a delayed version of the signal on the interconnect line, by delaying the change of the signal on the interconnect line. An inverter can be used for inverting the control signal in order to produce an inverted control signal. The control and the inverted control signal are employed to preset the operation modes for the voltage step-down detecting device, the voltage step-down charging device, the voltage step-up detecting device, the voltage step-up discharging device in order to make them operable for the next change of the signal on the interconnect line.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
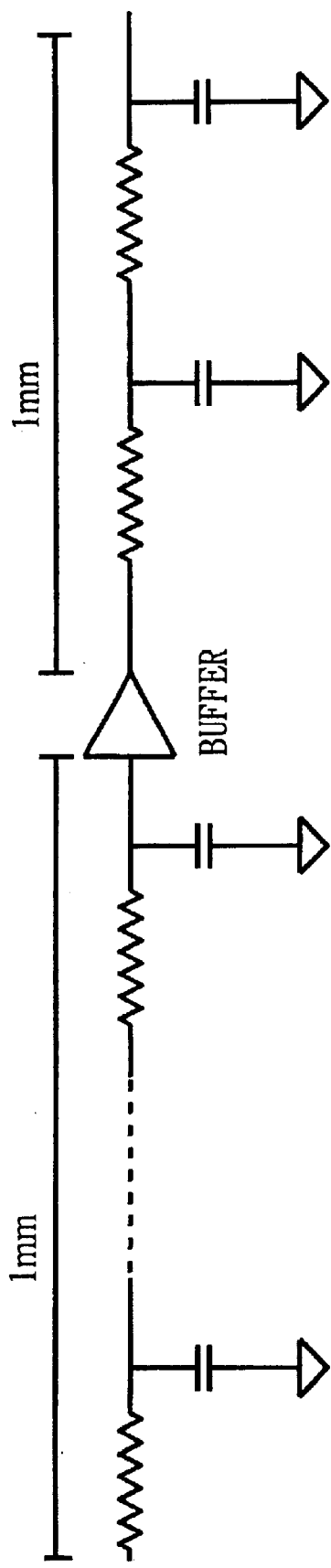
FIG. 1 illustrates a buffer inserted into an interconnect line in the middle so as to reduce interconnect delay.
Figure 2:
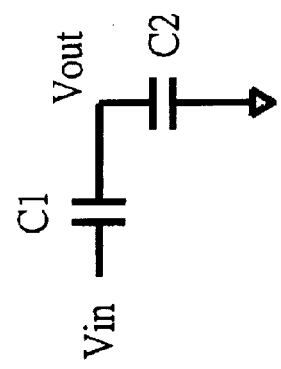
FIG. 2 illustrates capacitor coupling.

Capacitor coupling is employed in the invention to provide triggering devices and accelerating devices that meet the design needs for reduction in the time delay of the signals transmitted on the interconnect lines. The use of capacitor coupling is illustrated in FIG. 2. As shown in FIG. 2, when the input signal $V_{in}$ changes, the output signal $V_{out}$ changes with the input signal $V_{in}$ because of the capacitor-coupling effect. As a result, the voltage change of the output signal $V_{out}$ relates to that of the input signal $V_{in}$, and capacitors C1 and C2 by:

$$\Delta Vout = \frac{C_1}{C_1 + C_2} \Delta Vin.$$

If the capacitor C1 is sufficiently large, the change of $V_{out}$ will be substantially equal to that of $V_{in}$, as indicated in the above relationship between $V_{out}$ and $V_{in}$. On the basis of this theory, triggering devices and accelerating devices, as well as their application to signal transmission, will be described in the following embodiments.

FIRST EMBODIMENT

Figure 3:
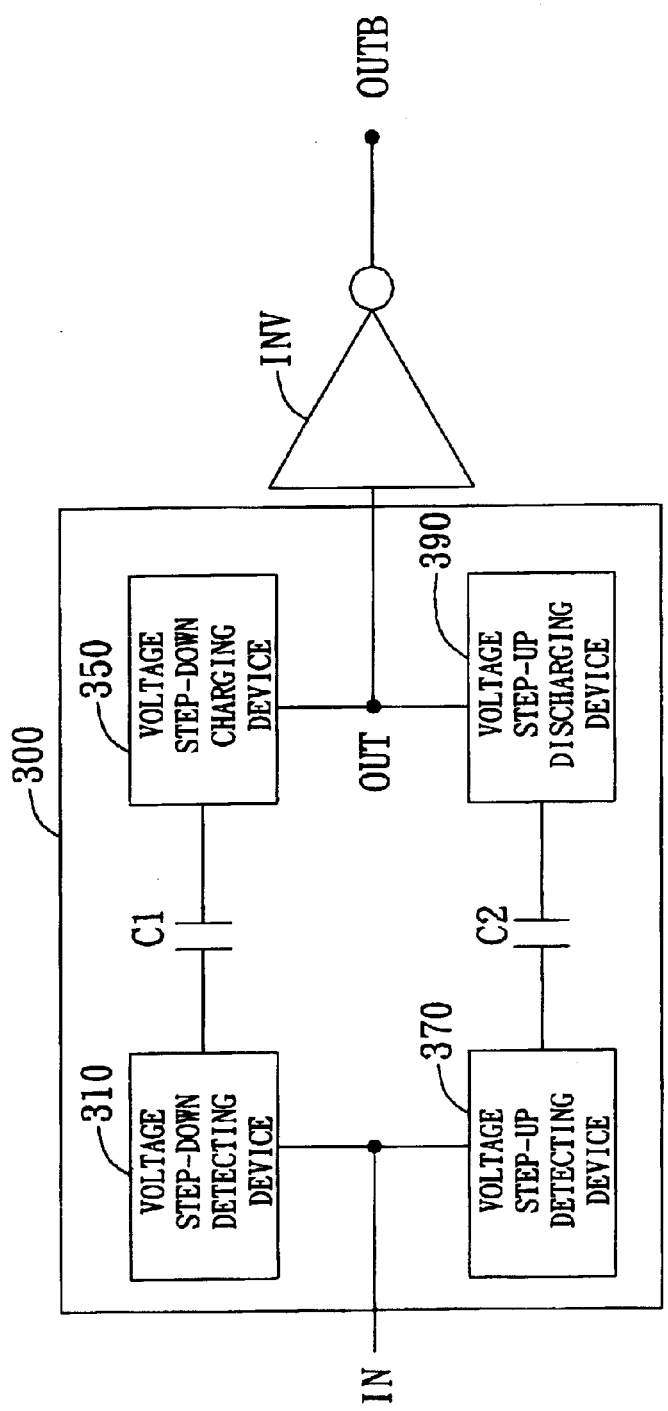
FIG. 3 is a block diagram of a high-threshold capacitor-coupling trigger according to a first embodiment of the invention.

A high-threshold capacitor-coupling trigger 300 is illustrated in FIG. 3 according to a first embodiment of the invention in block diagram form. The high-threshold capacitor-coupling trigger (HCCT) 300 includes two capacitors C1, C2, a voltage step-down detecting device 310, a voltage step-down charging device 350, a voltage step-up detecting device 370, and a voltage step-up discharging device 390. The high-threshold capacitor-coupling trigger 300 has an output signal at the output terminal OUT and the output signal is a delayed version of an input signal IN. The voltage step-down detecting device 310 is used for detecting a slow decrease in the voltage of an input signal IN and outputting a step-down signal corresponding to and being delayed against the slow decrease during the slow increase. When the input signal IN decreases from a high level to a predetermined value, the voltage step-down detecting device 310 outputs the step-down signal corresponding to the decrease of the input signal IN. The step-down signal, through the coupling effect of the capacitor C1, is then passed to the voltage step-down charging device 350. On receiving the step-down signal, the voltage step-down charging device 350 begins charging the output terminal OUT according to the step-down signal. That is, the step-down transition of the input signal IN from the high level to the predetermined value causes the output signal from the output terminal OUT to rise to a high level. In addition, the voltage step-up detecting device 370 is used for detecting a slow increase in the voltage of the input signal IN and outputting a step-up signal corresponding to and being delayed against the slow increase during the slow increase. When the input signal IN increases from a low level to a predetermined value, the voltage step-up detecting device 370 outputs the step-up signal corresponding to the increase of the input signal IN. The step-up signal, through the coupling effect of the capacitor C2, is then passed to the voltage step-up discharging device 390. On receiving the step-down signal, the voltage step-up discharging device 390 begins discharging the output terminal OUT. That is, the step-up transition of the input signal IN from the low level to the predetermined value causes the output signal from the output terminal OUT to fall to the low level.

Signals corresponding to the input signal can be employed for controlling the status of the high-threshold capacitor-coupling trigger 300 because the input signal ($V_{IN}$) at the input terminal controls the charging and discharging of the output terminal of the high-threshold capacitor coupling trigger 300. The voltage step-up discharging device 390 can be made unaffected by the voltage decrease of the input signal $V_{IN}$ by disabling both the voltage step-up detecting device 370 and the voltage step-up discharging device 390 when the input signal $V_{IN}$ is in the high level. Likewise, the voltage step-down charging device 350 can be made unaffected by the voltage increase of the input signal IN by enabling both the voltage step-down detecting device 310 and the voltage step-down charging device 350 when the input signal $V_{IN}$ is in the low level. In addition, the input terminal of an inverter (INV) can be connected to the output terminal OUT of the high-threshold capacitor-coupling trigger 300 so that the output terminal (OUTB) of the inverter changes its voltage level as the output terminal OUT does. In this way, the output signal $V_{OUTB}$ at the output terminal OUTB can be used to control the status of the high-threshold capacitor-coupling trigger 300. Further, the status of the high-threshold capacitor-coupling trigger 300 can be controlled by the feedback of the signal similar to the output signal $V_{OUTB}$, for example, the output signal of a serial connection of two inverters coupled to the input terminal IN.

Figure 4A:
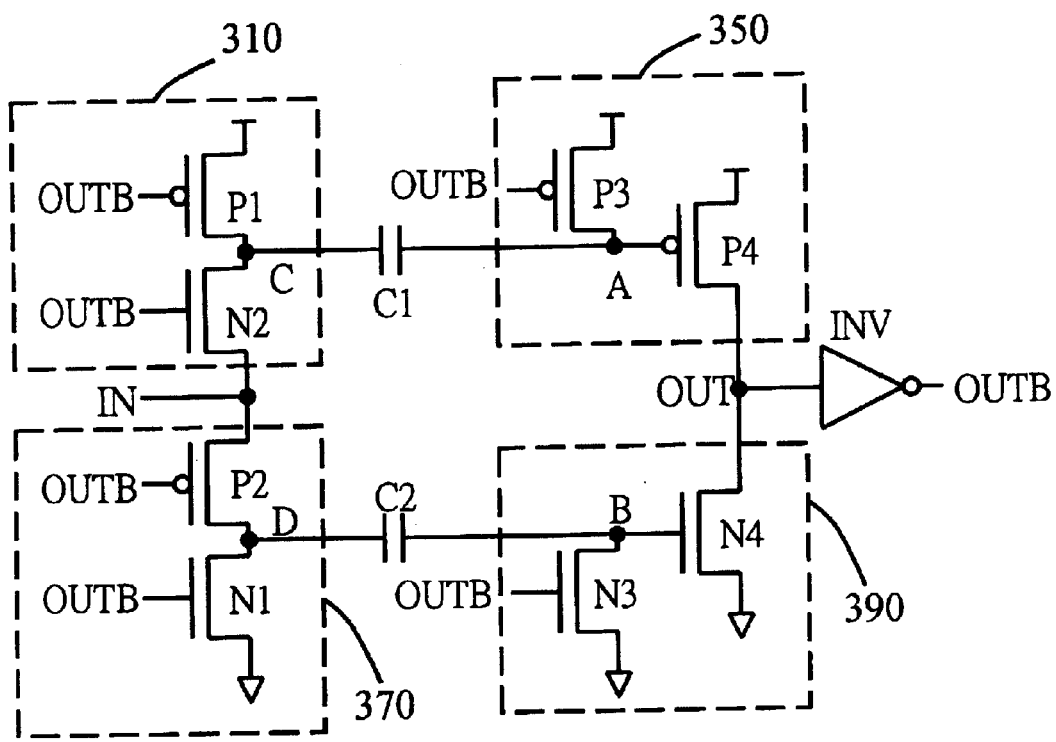
FIG. 4A illustrates the implementation of the capacitor-coupling trigger in FIG. 3 by using semiconductor devices.

The high-threshold capacitor-coupling trigger 300 can be implemented with semiconductors, for example, as shown in the circuit diagram in FIG. 4A. The voltage step-down detecting device 310 includes a PMOS P1 and an NMOS N2. The source and the gate of P1 are coupled to a power terminal and the output terminal OUTB of the inverter INV, respectively. The drain and the gate of N2 are coupled to the drain of P1 and the output terminal OUTB of the inverter INV, respectively. In addition, the source of N2 is used for receiving the input signal at the input terminal IN and the drain of N2 is used as the output terminal of the voltage step-down detecting device 310. The voltage step-down charging device 350 includes PMOSs P3 and P4. P4 is employed to charge the output terminal of the voltage step-down charging device 350 in response to a voltage decrease at the gate of P4. The source, the gate, and the drain of P4 are coupled to a power terminal, the capacitor C1, and the output terminal OUTB of the inverter, respectively. The drain of P4 is used as the output terminal of the voltage step-down charging device 350. P3 is used for charging the gate of P4 according to the output signal from the output terminal OUTB of the inverter INV. The source, the drain, and the gate of P3 are coupled to the power terminal, the capacitor C1, and the output terminal OUTB of the inverter INV, respectively. The voltage step-up detecting device 370 includes an NMOS N1 and a PMOS P2. The source and the gate of N1 are coupled to a ground terminal and the output terminal OUTB of the inverter INV, respectively. The drain and the gate of P2 are coupled to the drain of N1 and the output terminal OUTB of the inverter INV respectively. Moreover, the source of P2 is used for receiving the input signal at the input terminal IN and the drain of P2 is used as the output terminal of the voltage step-up detecting device 370. The voltage step-up discharging device 390 includes NMOSs N3 and N4. N4 is employed to discharge the output terminal of the voltage step-up discharging device in response to a voltage increase at the gate of N4. The source, the gate, and the drain of N4 are coupled to the ground terminal, the capacitor C2, and the input terminal of the inverter INV, respectively, wherein the drain of N4 is used as the output terminal of the voltage step-up discharging device. N3 is used for discharging the gate of N4 according to an output signal outputted from the output terminal OUTB of the inverter INV. The source, the drain, and the gate of N3 are coupled to the ground terminal, the capacitor C2, and the output terminal OUTB of the inverter INV, respectively.

Figure 4B:
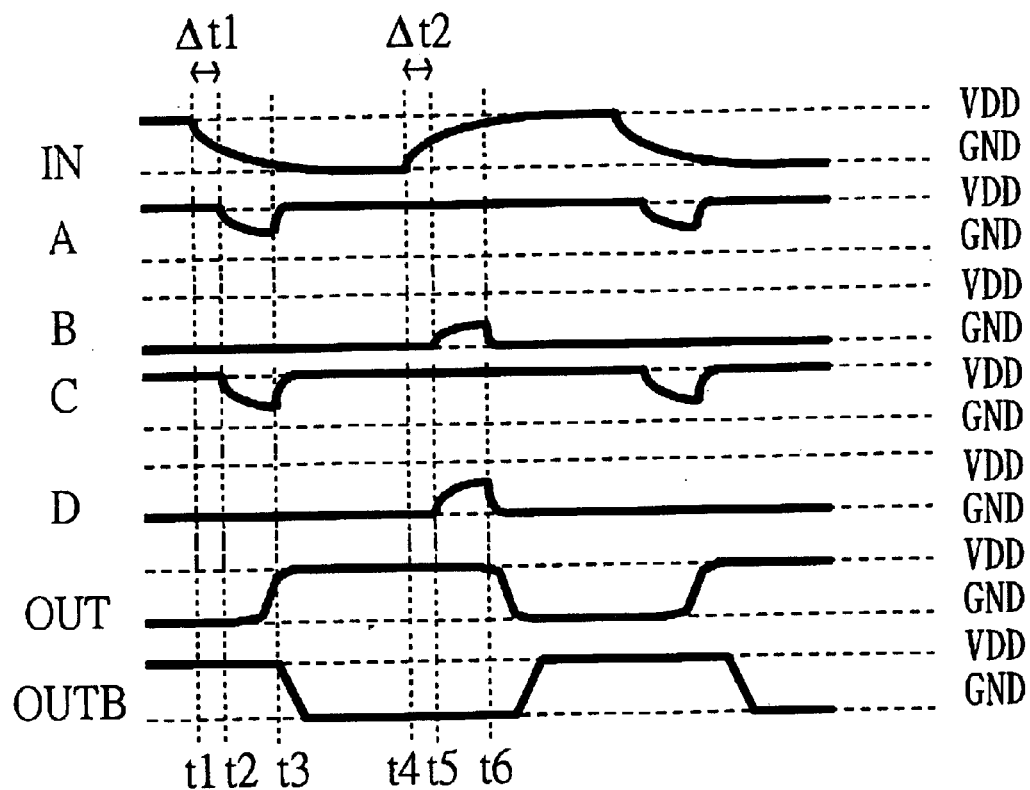
FIG. 4B is a timing diagram illustrating the signals in FIG. 4A.

Two possible operations of the high-threshold capacitor-coupling trigger shown in FIG. 4A are described. In the initial state of the first operation, the input signal $V_{IN}$ at the input terminal IN, the output voltage $V_{OUT}$ at the output terminal OUT, and the output signal $V_{OUTB}$ at the output terminal OUTB are supposed to have a voltage level of VDD, ground, and VDD, respectively. In addition, the input signal $V_{IN}$ is supposed to decrease from the voltage level of VDD. When $V_{IN}$ drops to VDD−$V_t$, the voltage at node C begins to fall with $V_{IN}$. The voltage signal at node C, that is, the output signal of the voltage step-down detecting device 310, is referred to as a step-down signal. The step-down signal is then coupled to node A by the capacitor coupling effect of the capacitor C1. As a result, the voltage at node A also drops with that at node C. When the voltage at node A drops by a value of $V_t$, P4 is enabled to charge the output terminal OUT. When the voltage at the output terminal OUT reaches the value of VDD, the output signal $V_{OUT}$ will be zero. In this case, the PMOSs P1, P2, P3 are enabled to charge nodes A and C. In the second operation, the input signal $V_{IN}$ is supposed to rise from zero. When the input signal $V_{IN}$ increases to the value of $V_t$, the voltage at node D starts to rise with the input signal $V_{IN}$. The voltage signal at node D, that is, the output signal of the voltage step-up detecting device 370, is called a step-up signal. The step-up signal is then coupled to node B by the capacitor coupling effect of the capacitor C2. Hence, the voltage at node B rises with that at node D. When the voltage at node B drops by a value of $V_t$, N4 is enabled to discharge the output terminal OUT. When the voltage at the output terminal OUT reaches the value of zero, the output signal $V_{OUTB}$ will be equal to VDD. In this case, the NMOSs N1, N2, N3 are enabled to discharge nodes B and D. The timing diagram corresponding to the above operations on the signals involved in FIG. 4A is shown in FIG. 4B. In FIG. 4A, Δt1 indicates the period for the input signal $V_{IN}$ at the input terminal IN to drop from the high level so as to enable the NMOS N2, and Δt2 indicates the period for the input signal $V_{IN}$ at the input terminal IN to rise from the low level so as to enable the PMOS P2.

The circuit shown in FIG. 4A can be employed as a delaying buffer because a delay corresponding to the value of $V_t$ is produced by the PMOS P2 and the NMOS N2 to make the output signal $V_{OUT}$ a delayed version of the input siganl $V_{IN}$. In addition, the delay of the circuit can be adjusted by the desired threshold and the threshold can be determined by controlling the magnitude of the capacitors.

SECOND EMBODIMENT

Figure 5:
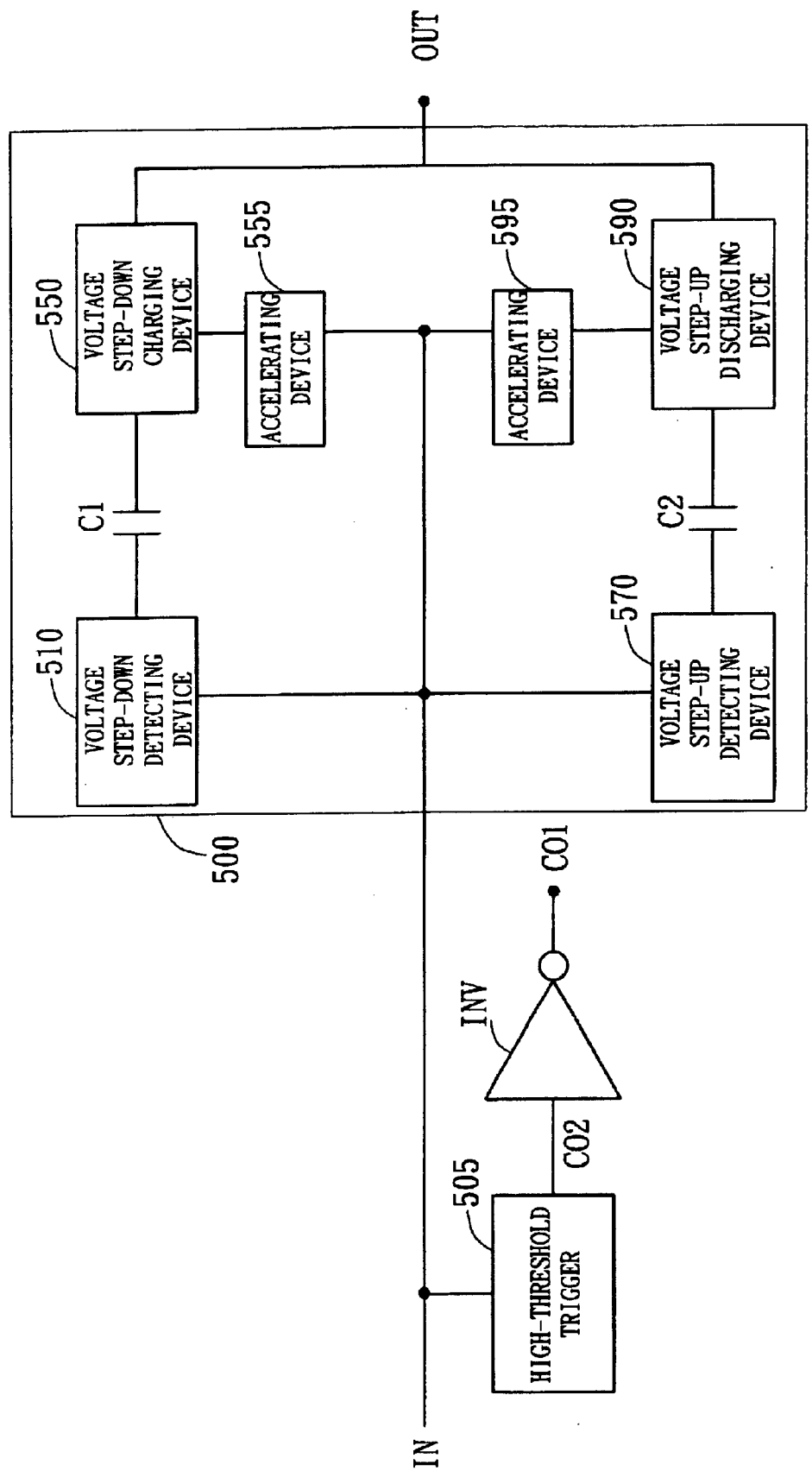
FIG. 5 is a block diagram of a low-threshold capacitor-coupling trigger according to a second embodiment of the invention.

A low-threshold capacitor-coupling trigger 500, as shown in FIG. 5, is a block diagram of a second embodiment of the invention, with an input terminal IN and an output terminal OUT. The low-threshold capacitor-coupling trigger 500 can be used as a signal receiver for signals from an interconnect line, for example. The low-threshold capacitor-coupling trigger 500 includes capacitors C1, C2, accelerating devices 555, 595, a voltage step-down detecting device 510, a voltage step-down charging device 550, a voltage step-up detecting device 570, and a voltage step-up discharging device 590. The voltage step-down detecting device 510, coupled to the input terminal IN, is used for detecting a slow voltage decrease of an input signal at the input terminal so as to output a step-down signal corresponding to the input signal. When the input signal drops from a high level, the voltage step-down detecting device 510 outputs the step-down signal according to the decrease of the input signal. The step-down signal, through the capacitor coupling effect of the capacitor C1, is then transferred to the voltage step-down charging device 550. Thus, the voltage step-down charging device 550 is enabled to charge the output terminal OUT. In other words, the voltage at the output terminal OUT rises while the input signal falls from the high level. Particularly, the voltage at the output terminal OUT is rising faster because charging the output terminal OUT with the voltage step-down charging device 550 is accelerated by the starting of the accelerating device 555 when the voltage step-down charging device 550 charges the output terminal OUT. The voltage step-up detecting device 570, coupled to the input terminal of the low-threshold capacitor-coupling trigger 500, is used for detecting a slow voltage increase of the input signal so as to output a step-up signal corresponding to the input signal. When the input signal applied to the input terminal IN rises from the low level, the voltage step-up detecting device 570 outputs the step-up signal corresponding to the rise of the input signal. The step-up signal, through the capacitor coupling effect of the capacitor C2, is transferred to the voltage step-up discharging device 590 so as to enable the voltage step-up discharging device 590 to discharge the output terminal OUT. In other words, the input signal rises from the low level so that the voltage at the output terminal OUT falls accordingly. Particularly, the voltage at the output terminal OUT is falling faster because discharging the output terminal OUT with the voltage step-up discharging device 590 is accelerated by the starting of the accelerating device 595 when the voltage step-up discharging device 590 discharges the output terminal OUT.

Further, the low-threshold capacitor-coupling trigger 500 can be predetermined in different operating states by two control signals CO1 and CO2, for example. The control signal CO2 is produced by a high-threshold trigger 505 according to the input signal at the input terminal IN. The high-threshold trigger 505 is used for producing the control signal CO2 which lags behind this input signal, and can be, for example, the high-threshold capacitor-coupling trigger 300 disclosed in the first embodiment or any other device that can achieve this purpose (e.g. Schmitt trigger). Another control signal CO1 is an inverted version of the control signal CO2 and can be produced by using an inverter, such as the inverter INV indicated in FIG. 5. The control signals CO1 and CO2 can be used for presetting the operating states of the voltage step-down detecting device 510, the voltage step-down charging device 550, the voltage step-up detecting device 570, and the voltage step-up discharging device 590. An example of the implementation of FIG. 5 and its operating state predetermination will be provided in the following.

Figure 6A:
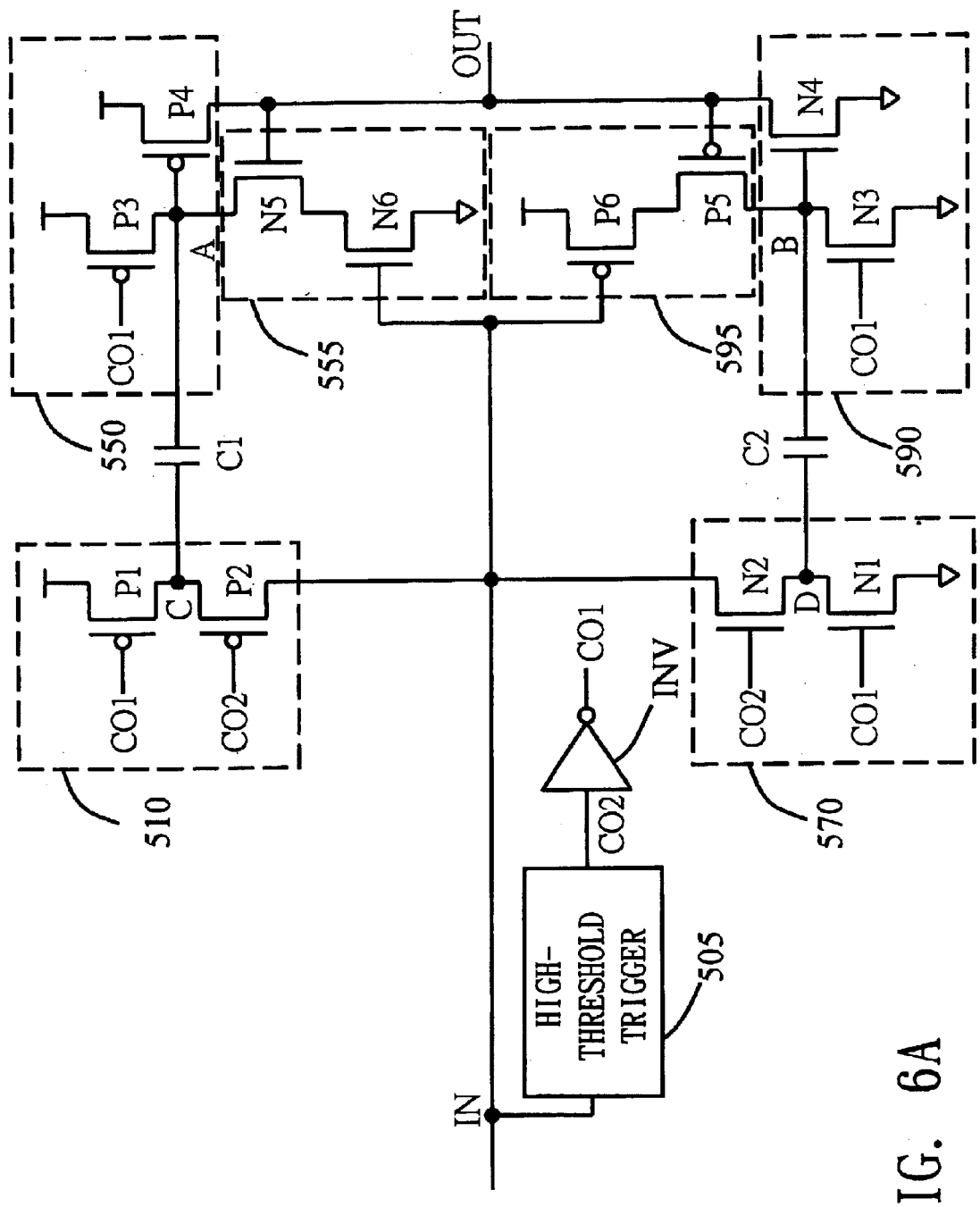
FIG. 6A illustrates the implementation of the capacitor-coupling trigger in FIG. 5 by using semiconductor devices.

As shown in FIG. 6A, the low-threshold capacitor-coupling trigger 500 in FIG. 5 is implemented with semiconductors. The voltage step-down detecting device 510 includes PMOSs P1 and P2. The source of P1 is coupled to a power terminal while the gate of P1 is used for receiving the inverted control signal CO1. The source of P2 is coupled to the drain of P1. The gate and the drain of P2 are used for receiving the control signal CO2 and the input signal at the input terminal IN respectively. The source of P2 (i.e. node C) is used as the output terminal of the voltage step-down detecting device 510. The voltage step-down charging device 550 includes PMOSs P3 and P4. P4 is used for charging the output terminal OUT in response to a decrease in the voltage of the gate of P4. The source, the gate, and the drain of P4 are coupled to a power terminal, the capacitor C1, and the output terminal OUT, respectively. The source, the drain, and the gate of P3 are coupled to the power terminal, the capacitor C1, the output terminal of the inverter NV, respectively. The PMOS P3 is used for charging the gate of P4 according to the inverted control signal CO1. The accelerating device 555 is a positive feedback discharging loop for discharging the voltage step-down charging means, and includes NMOSs N5 and N6, for example. The drain and the gate of N5 are coupled to the gate and the drain of P4, respectively. The drain, the source, and the gate of N6 are coupled to the source of N5, the ground terminal, and the input terminal IN respectively. The voltage step-up detecting device 570 includes NMOSs N1 and N2. The source of N1 is coupled to the ground terminal while the gate of N1 is used for receiving the inverted control signal CO1. The source of N2 is coupled to the drain of N1. The gate of N2 is used for receiving the control signal CO2. The drain of N2 is used for receiving the input signal at the input terminal IN, and the source of N2 is used as the output terminal of the voltage step-up detecting device 570. The voltage step-up discharging device 590 includes NMOSs N3 and N4. N4 is used for discharging the output terminal OUT in response to a voltage increase of the gate of N4. The source, the gate, and the drain of N4 are coupled to the ground terminal, the capacitor C2, and the output terminal OUT respectively. N3 is used for charging the gate of N4 according to the inverted control signal. The source, the drain, and the gate of N3 are coupled to the ground terminal, the capacitor C2, the output terminal of the inverter INV, respectively. The accelerating device 595 is a positive feedback charging loop for charging the voltage step-up discharging device, and includes PMOSs P5 and P6, for example. The drain and the gate of P5 are coupled to the gate and the drain of N4, respectively. The drain, the source, and the gate of P6 are coupled to the source of P5, the power terminal, and the input terminal IN respectively.

As shown above, the main difference in implementation between the first and the second embodiments is the two positive feedback loops, including the accelerating devices 555 and 595 individually, for accelerating the response speed of the latter. In addition, the voltage step-down detecting devices in FIGS. 4A and 6A are different.

Figure 6B:
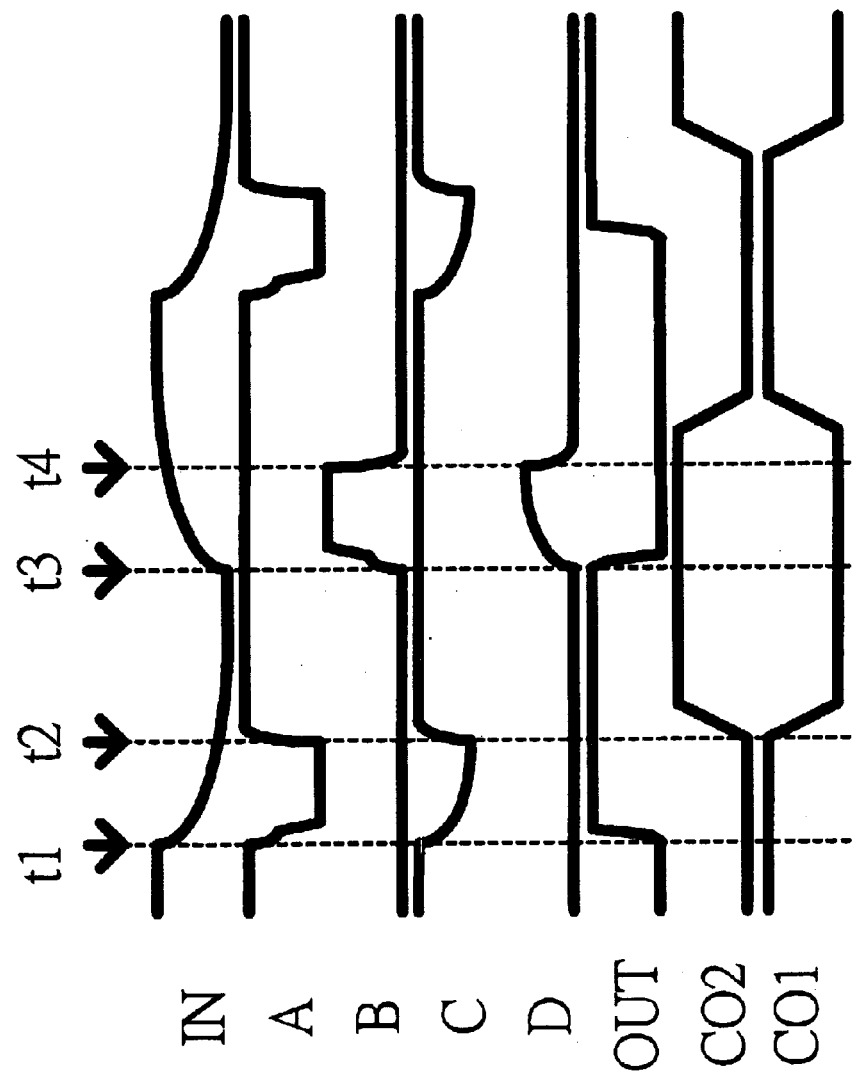
FIG. 6B is a timing diagram illustrating the signals in FIG. 6A.

In the following, two operation modes of the low-threshold capacitor-coupling trigger 500 in FIG. 6A are described. In addition, the timing diagram of the signals involved in this circuit can be referred to FIG. 6B. In the initial state of the first operation, the voltage at the input terminal IN, the voltage of the inverted control signal CO1, the voltage at the output terminal OUT, and the voltage of the control signal CO2 are supposed to be VDD, VDD, ground, and ground respectively. When the input signal at the input terminal IN begins to fall at time t1 (as indicated in FIG. 6B), the voltage at node C, that is, the step-down signal, drops as well. By the coupling effect of the capacitor C1, the voltage at node A decrease as the voltage at node C does. When the voltage at node A drops by a value of $V_t$, P4 is enabled to charge the output terminal OUT. When the voltage at the output terminal OUT rises by a value of $V_t$, N5 is enabled to begin discharging node A through N6. In other words, a positive feedback loop is formed with the accelerating device 555. The charging speed of the output terminal OUT with P4 is increased after node A is discharged. Thus, the output terminal OUT has a sharp increase in voltage. In addition, the control signal CO2 lags behind the output signal at the output terminal OUT because of the characteristics of the high-threshold trigger 505, and then the inverted control signal CO1 changes to 0 when the control signal CO2 changes to VDD. When the inverted control signal CO1 changes to 0, the PMOS P1, P3, P6, and NMOS N2 are enabled to charge nodes A and C to VDD, as indicated at time t2 in FIG. 6B. As a result, preparation for the next signal transition is done. That is, the operating states of the voltage step-down detecting device 510, the voltage step-down charging device 550, the voltage step-up detecting device 570, and the voltage step-up discharging device 590 can be preset by the control signal CO2 and the inverted control signal CO1 in order to prepare the low-threshold capacitor-coupling trigger 500 for the next signal level transition.

In the second operation, the input signal at the input terminal IN has a transition from 0 to VDD. When the input signal at the input terminal IN begins to rise at time t3 (as indicated in FIG. 6B), the voltage at node D, that is, the step-up signal, rises as well. By the coupling effect of the capacitor C2, the voltage at node B increases as the voltage at node D does. When the voltage at node B rises by a value of $V_t$, N4 is enabled to begin to discharge the output terminal OUT. When the voltage at the output terminal OUT drops by a value of $V_t$, P5 is enabled to begin charging node B through P6. In other words, a positive feedback loop is formed with the accelerating device 595. The discharging speed of the output terminal OUT with N4 is increased after node B is charged. Thus, the output terminal OUT has a sharp decrease in voltage. In addition, the control signal CO2 lags behind the output signal at the output terminal OUT because of the characteristics of the high-threshold trigger 505, and then the inverted control signal CO1 changes to VDD when the control signal CO2 changes to 0. When the inverted control signal CO1 changes to VDD, the NMOS N1, N3, N6, and PMOS P2 are enabled to discharge nodes B and D to ground, as indicated at time t4 in FIG. 6B. As a result, preparation for the next signal transition is done. That is, the operating states of the voltage step-down detecting device 510, the voltage step-down charging device 550, the voltage step-up detecting device 570, and the voltage step-up discharging device 590 can be preset by the control signal CO2 and the inverted control signal CO1 for the next signal transition.

As compared with the high-threshold capacitor-coupling trigger 300, the low-threshold capacitor-coupling trigger 500 has a different input stage and two positive feedback loops. In addition, the input stage of the low-threshold capacitor-coupling trigger 500 causes the delay of the signal transition occurred at node C or D to be reduced by a time corresponding to a voltage change of $V_t$. Further, the two positive feedback loops are applied in the low-threshold capacitor-coupling trigger 500 so that the delay of the low-threshold capacitor-coupling trigger 500 can be made quite small if sufficient large values of the capacitors C1 and C2 are taken.

The low-threshold capacitor-coupling trigger 500 according to the second embodiment has the following advantages:
1. The threshold can be adjusted to the design needs by changing the values of the capacitors used in the circuit.
2. Short-circuited current is reduced because the PMOS P4 and NMOS N4 of the output stage will not be enabled simultaneously and no DC current is produced in the operation of the circuit.
3. The circuit operation is accelerated because the loads at nodes A and C are reduced by separating the input signal at the input terminal from nodes A and C with the capacitors C1 and C2, respectively if the input load is large.
4. No external control signal is needed, thus contributing to the reduction in complexity. The control signals involved in the circuit operation are generated internally.
5. The application of the low-threshold capacitor-coupling accelerator to a receiver connected to a long interconnect line can adjust the input signal to the receiver in low dissipation and at high speed.

THIRD EMBODIMENT

Figure 7:
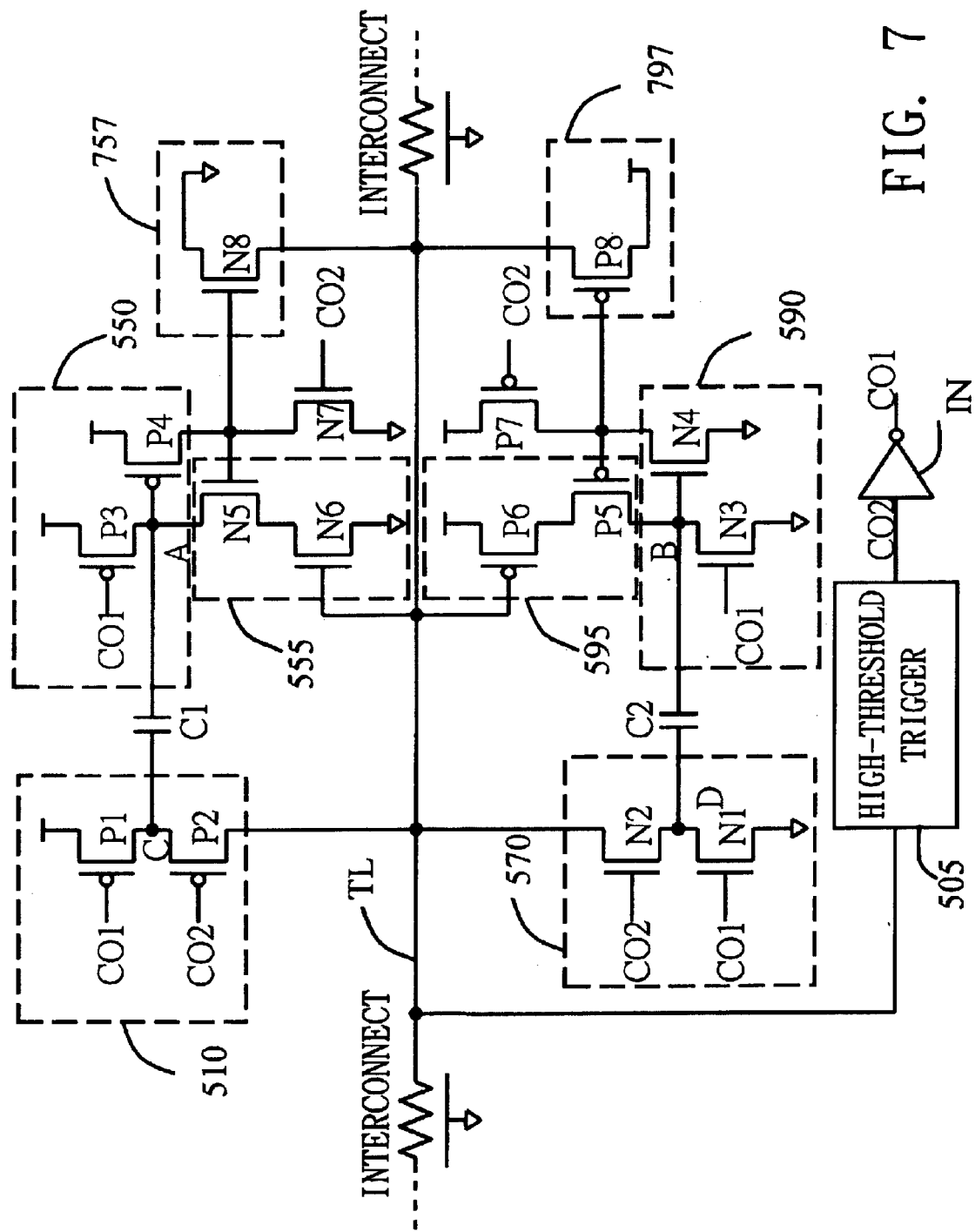
FIG. 7 is a block diagram of a capacitor-coupling accelerator according to a third embodiment of the invention.

A capacitor-coupling accelerator is illustrated in FIG. 7 according to a third embodiment of the invention. The capacitor-coupling accelerator shown in FIG. 7 is an accelerator based on the circuit configuration of the second embodiment and can be disposed on an interconnect line TL to accelerate the signal transition occurred on the interconnect line TL. The capacitor-coupling accelerator can be designed to be in the middle of the interconnect line TL to accelerate the signal transition occurred on the interconnect line TL. Because some of the circuit components of the capacitor-coupling accelerator in FIG. 7, including the capacitors C1, C2, the accelerating devices 555, 595, the voltage step-down detecting device 510, the voltage step-down charging device 550, the voltage step-up detecting device 570, and the voltage step-up discharging device 590, are identical to those in the second embodiment, the detailed operations of these components will not be described. Instead, the operation of a discharging device 757 and a charging device 797 will be described since the discharging device 757 and the charging device 797, for example, NMOS N8 and PMOS P8 respectively, belong to the capacitor-coupling accelerator in FIG. 7, not to the second embodiment.

When the input signal at the input terminal IN decreases from the high level, the voltage at node A falls with that at node C as so to enable the NMOS N8 to discharge the interconnect line TL. The voltage of the interconnect line TL is then lowered. The signal on the interconnect line TL decreases more rapidly because the positive feedback loop with the accelerating device 555 accelerates the discharging of the interconnect line TL with the NMOS N8. Conversely, when the input signal at the input terminal IN increases from the low level, the voltage at node B rises with that at node D as so to enable the PMOS P8 to charge the interconnect line TL. The voltage of the interconnect line TL is then increased. The signal on the interconnect line TL increases more rapidly because the positive feedback loop with the accelerating device 595 accelerates the charging of the interconnect line TL with the PMOS P8.

Figure 8A:
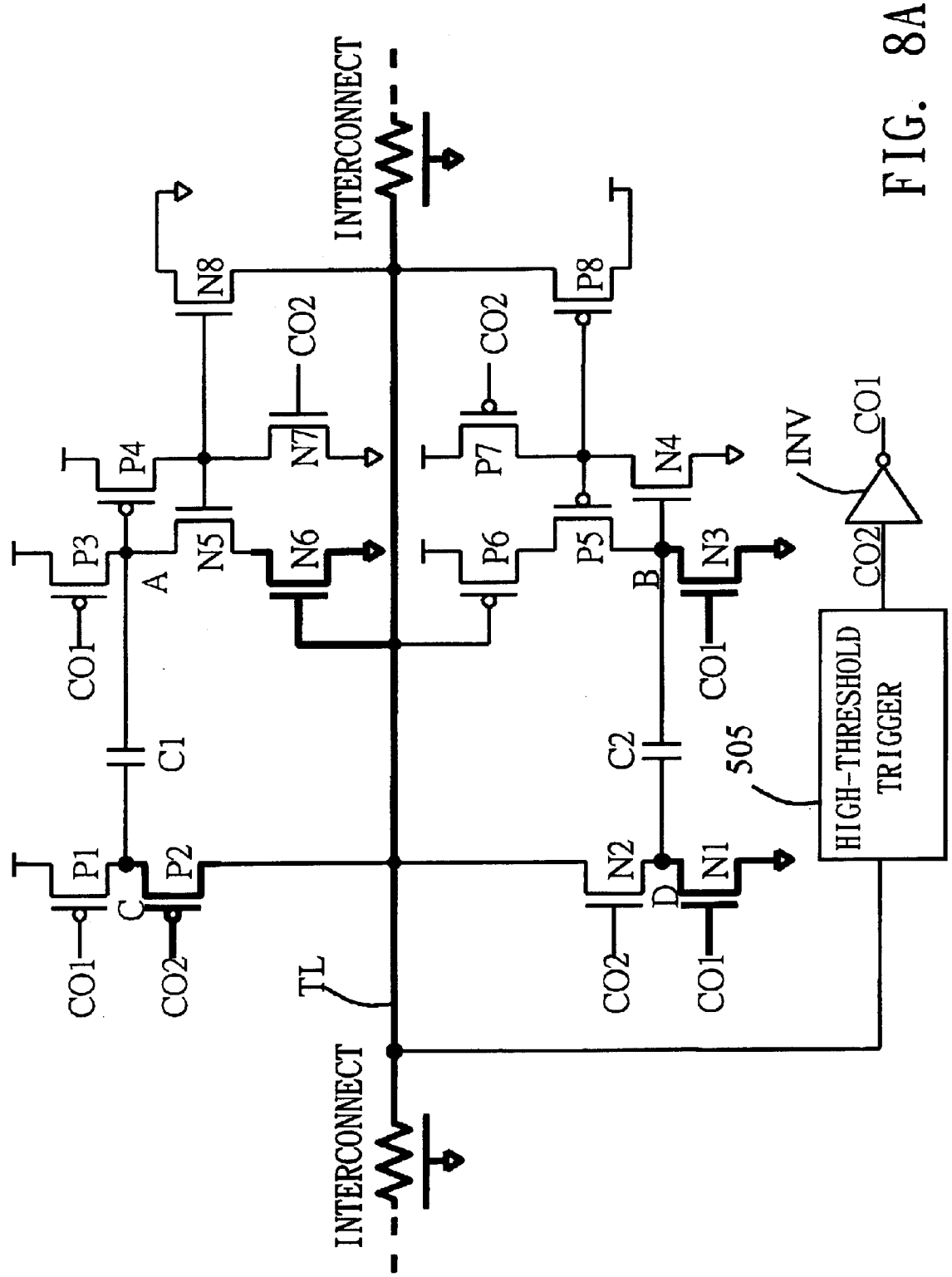
FIG. 8A illustrates the operation of the capacitor-coupling accelerator in FIG. 7 in a high steady state.
Figure 8B:
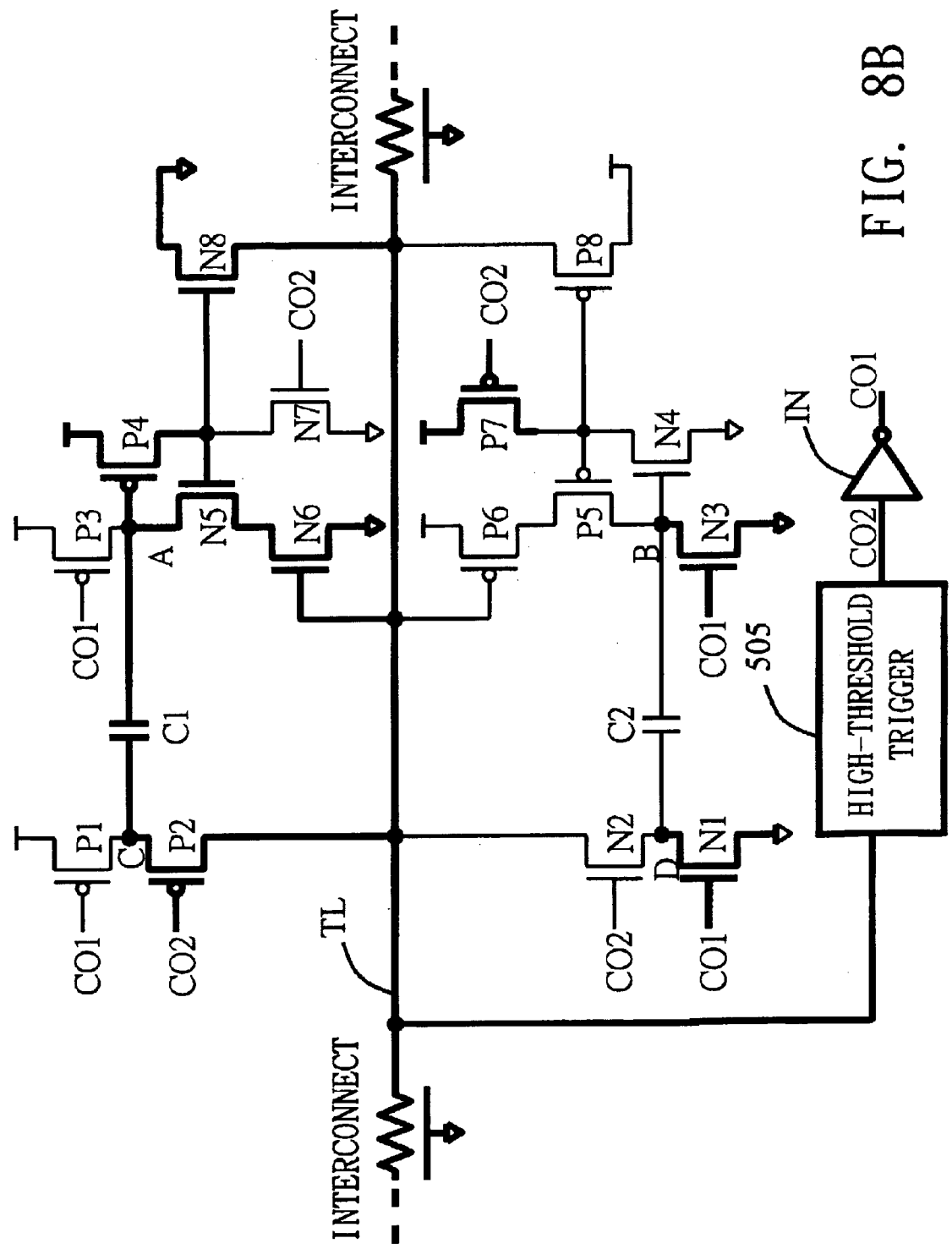
FIG. 8B illustrates the operation of the capacitor-coupling accelerator in FIG. 7 in a transition from a high-level voltage to a low-level voltage.
Figure 8C:
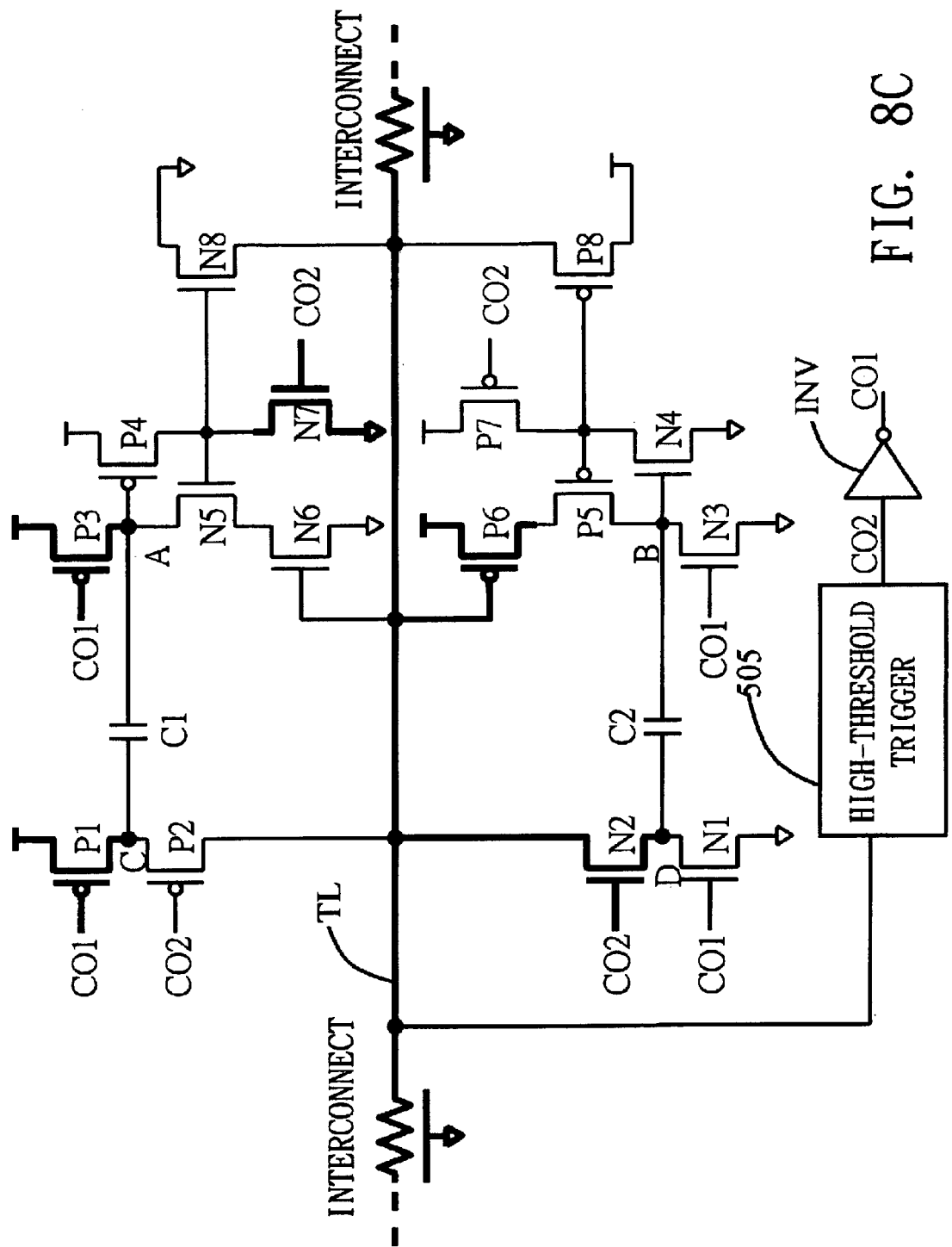
FIG. 8C illustrates the operation of the capacitor-coupling accelerator in FIG. 7 in a low steady state.
Figure 8D:
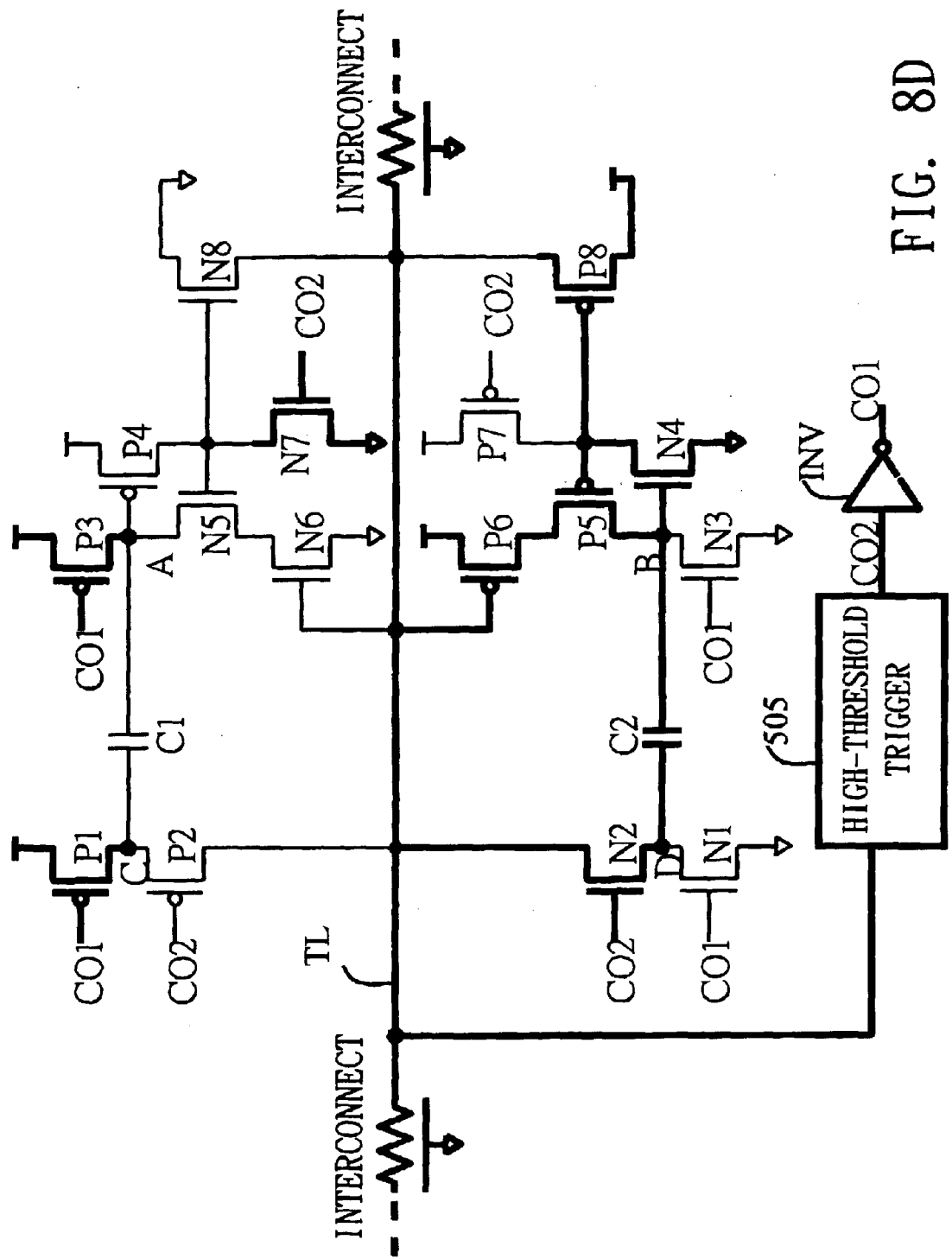
FIG. 8D illustrates the operation of the capacitor-coupling accelerator in FIG. 7 in a transition from a low-level voltage to a high-level voltage.

The operations of the capacitor-coupling accelerator are illustrated in FIGS. 8A to 8D according to the third embodiment of the invention, wherein the devices and the interconnect lines that are enabled or transmit signals are drawn in bold. FIG. 8A illustrates the capacitor-coupling accelerator operating in a high steady state. Initially, the signal on the interconnect line TL is supposed to be equal to VDD so that the control signal CO2 is 0 and the inverted control signal CO1 is VDD. FIG. 8B illustrates the capacitor-coupling accelerator when the input signal changes from the high level to the low level. When the signal on the interconnect line TL begins to decrease, the voltage at node C falls as well. The voltage at node A decreases with the voltage at node C by the coupling effect of the capacitor C1. When the voltage at node A drops by a value of $V_t$, P4 is enabled to charge the gate of N8. N5 and N8 will be enabled when the gate voltage of N8 increases by a value of $V_t$. In this case, discharging occurs at node A through N5, which is a positive feedback process. In addition, discharging occurs on the interconnect line TL through N8, accelerating the fall of the signal on the interconnect line TL. When the voltage on the interconnect line TL drops to 0, the control signal CO2 and the inverted control signal CO1 become VDD and 0 respectively by the high-threshold trigger 505 and inverter INV. As a result, P1, P3, N2, and N7 are enabled, the voltages at nodes A and C are pulled high to VDD and the potential of the interconnect line TL is pulled down to 0, as indicated in FIG. 8C. Further, when the voltage on the interconnect line TL changes from 0 to VDD, the operation of the capacitor-coupling accelerator corresponds to the above with the corresponding components in the lower part of the schematic diagram, as illustrated in FIG. 8D.

The capacitor-coupling accelerator according to the third embodiment has the following advantages:
1. The output stage will not be enabled at the same time and thus no short-circuited current occurs during the operation of the circuit.
2. The loads at nodes A and C become smaller by physically separating the input signal from nodes A and C with the capacitors C1 and C2, thus accelerating the circuit operation.
3. The accelerator is fully controlled by its control signals. The complexity of the whole chip to which the accelerators are applied will not be increased because no external control signal is needed.

4. Circuit operation is accelerated because the discharging and charging loops of the output stage employ a serially-connected NMOS and a serially-connected PMOS respectively.

5. The accelerator can be applied to bi-directional interconnect lines.

In brief, the capacitor-coupling trigger and the capacitor-coupling accelerator disclosed above have the following advantages:

1. The threshold can be adjusted to the design needs by changing the values of the capacitors used in the circuit.
2. Short-circuited current is reduced because the PMOS P4 and NMOS N4 of the output stage will not be enabled simultaneously. In addition, reduced power dissipation is achieved because no DC current is produced during the operation of the circuit.
3. The circuit operation is accelerated because the loads at nodes A and C are reduced by separating the input signal at the input terminal from nodes A and C with the capacitors C1 and C2 respectively.
4. No external control signal is needed, thus contributing to the reduction in circuit complexity. The control signals involved in the circuit operation are generated internally.
5. The application of the low-threshold capacitor-coupling accelerator to a receiver connected to a long interconnect line can adjust the input signal to the receiver in low dissipation and at high speed.
6. Circuit operation is accelerated because the discharging and charging loops of the output stage employ a serially-connected NMOS and a serially-connected PMOS respectively.
7. The accelerator can be applied to bi-directional interconnect lines.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for high-threshold capacitor-coupling triggering, which receives an input signal at an input terminal of the apparatus, and outputs an output signal at an output terminal of the apparatus according to the input signal, the apparatus comprising:

voltage step-down detecting means, with an output terminal, in response to a slow decrease in the voltage level of the input signal, for producing a step-down signal at the output terminal of the voltage step-down detecting means, wherein the step-down signal corresponds to and is delayed against the slow decrease during the slow decrease;

a first capacitor, coupled to the output terminal of the voltage step-down detecting means at one terminal of the first capacitor, for coupling the step-down signal with the other terminal of the first capacitor;

voltage step-down charging means, having an input terminal coupled to the other terminal of the first capacitor, having an output terminal coupled to the output terminal of the apparatus, and being controlled by the step-down signal from the first capacitor, for charging the output terminal of the apparatus;

voltage step-up detecting means, in response to a slow increase in the voltage level of the input signal, for producing a step-up signal corresponding to and being delayed against the slow increase during the slow increase;

a second capacitor, coupled to an output terminal of the voltage step-up detecting means at one terminal of the second capacitor, for coupling the step-up signal with the other terminal of the second capacitor; and voltage step-up discharging means, having an input terminal coupled to the other terminal of the second capacitor, having an output terminal coupled to the input terminal of the apparatus, and being controlled by the step-up signal from the second capacitor, for discharging the output terminal of the apparatus.

2. The apparatus according to claim 1, further comprising:

an inverter, having an input terminal coupled to the output terminal of the apparatus and having an output terminal coupled to the voltage step-down detecting means, the voltage step-up detecting means, the voltage step-down charging means, and the voltage step-up discharging means, the inverter being used for controlling the apparatus.

3. The apparatus according to claim 2, wherein the voltage step-down detecting means comprises:

a PMOS, the source and the gate of the PMOS being coupled to a power terminal and the output terminal of the inverter respectively; and an NMOS, the drain and the gate of the NMOS being coupled to the drain of the PMOS and the output terminal of the inverter respectively, wherein the source of the NMOS is used for receiving the input signal and the drain of the NMOS is used as the output terminal of the voltage step-down detecting means.

4. The apparatus according to claim 2, wherein the voltage step-down charging means comprises:

a first PMOS, for charging the output terminal of the voltage step-down charging means in response to a decrease in voltage at the gate of the first PMOS, wherein the source, the gate, and the drain of the first PMOS are coupled to a power terminal, the first capacitor, and the output terminal of the inverter respectively, and the drain of the first PMOS is used as the output terminal of the voltage step-down charging means; and a second PMOS for charging the gate of the first PMOS according to an output signal outputted from the output terminal of the inverter, wherein the source, the drain, and the gate of the second PMOS are coupled to the power terminal, the first capacitor, and the output terminal of the inverter respectively.

5. The apparatus according to claim 2, wherein the voltage step-up detecting means comprises:

an NMOS, the source and the gate of the NMOS being coupled to a ground terminal and the output terminal of the inverter respectively; and a PMOS, the drain and the gate of the PMOS being coupled to the drain of the NMOS and the output terminal of the inverter respectively, wherein the source of the PMOS is used for receiving the input signal of the apparatus and the drain of the PMOS is used as the output terminal of the voltage step-up detecting means.

6. The apparatus according to claim 2, wherein voltage step-up discharging means comprises:

a first NMOS, for discharging the output terminal of the voltage step-up discharging means in response to an increase in voltage at the gate of the first NMOS, wherein the source, the gate, and the drain of the first NMOS are coupled to a ground terminal, the second capacitor, and the input terminal of the inverter respectively, and the drain of the first NMOS is used as the output terminal of the voltage step-up discharging means; and a second NMOS for discharging the gate of the first NMOS according to an output signal outputted from the output terminal of the inverter, wherein the source, the drain, and the gate of the second NMOS are coupled to the ground terminal, the second capacitor, and the output terminal of the inverter respectively.

7. An apparatus for low-threshold capacitor-coupling triggering, having an input terminal and an output terminal, for receiving an input signal and producing an output signal according to the input signal, the apparatus comprising:

voltage step-down detecting means, coupled to the input terminal of the apparatus and having an output terminal, for detecting a slow decrease in the voltage level of the input signal so as to correspondingly produce a step-down signal at the output terminal of the voltage step-down detecting means;

a first capacitor, coupled to the output terminal of the voltage step-down detecting means, for passing the step-down signal;

voltage step-down charging means for receiving the step-down signal from the first capacitor so as to charge the output terminal of the apparatus, wherein the first capacitor being coupled between the voltage step-down charging means and the output terminal of the apparatus;

a first accelerating means, coupled to the voltage step-down charging means, for enabling the voltage step-down charging means to charge the output terminal of the apparatus at an increased charging speed;

voltage step-up detecting means, coupled to the input terminal of the apparatus and having an output terminal, for detecting a slow increase in the voltage level of the input signal so as to correspondingly output a step-up signal at the output terminal of the voltage step-up detecting means;

a second capacitor, coupled to the output terminal of the voltage step-up detecting means, for passing the step-up signal; and voltage step-up discharging means for receiving the step-up signal from the second capacitor so as to discharge the output terminal of the apparatus, wherein the second capacitor is coupled between the voltage step-up detecting means and the voltage step-up discharging means; and a second accelerating means, coupled to the voltage step-up discharging means, for enabling the voltage step-up discharging means to discharge the output terminal of the apparatus at an increased charging speed.

8. The apparatus according to claim 7, further comprising:

a high-threshold triggering means, coupled to the input terminal of the apparatus and having an output terminal, for delaying the input signal so as to output a control signal at the output terminal of the high-threshold triggering means; and an inverter, coupled to the output terminal of the high-threshold triggering means, for outputting an inverted control signal according to the control signal, wherein the control signal and the inverted control signal are used for pre-determining operating modes for the voltage step-down detecting means, the voltage step-down charging means, the voltage step-up detecting means, and the voltage step-up discharging means.

9. The apparatus according to claim 7, wherein the first accelerating means is a positive feedback discharging loop for discharging the voltage step-down charging means.

10. The apparatus according to claim 7, wherein the second accelerating means is a positive feedback charging loop for charging the voltage step-up discharging means.

11. The apparatus according to claim 8, wherein the voltage step-down detecting means comprises:

a first PMOS, the source of the first PMOS being coupled to a power terminal, and the gate of the first PMOS being used for receiving the inverted control signal; and a second PMOS, the source of the second PMOS being coupled to the drain of the first PMOS, the gate of the second PMOS being used for receiving the control signal, the drain of the second PMOS being used for receiving the input signal, and the source of the second PMOS being used as the output terminal of the voltage step-down detecting means.

12. The apparatus according to claim 8, wherein the voltage step-down charging means comprises:

a first PMOS, the source, the gate, and the drain of the first PMOS being coupled to a power terminal, the first capacitor, and the output terminal of the apparatus respectively, the first PMOS being used for charging the output terminal of the apparatus in response to a decrease in the voltage of the gate of the first PMOS; and a second PMOS, the source, the drain, and the gate of the second PMOS being coupled to the power terminal, the first capacitor, the output terminal of the inverter respectively, the second PMOS being used for charging the gate of the first PMOS according to the inverted control signal.

13. The apparatus according to claim 12, wherein the first accelerating means is a positive feedback discharging loop for discharging the voltage step-down charging means.

14. The apparatus according to claim 13, wherein the positive feedback discharging loop comprises:

a first NMOS, the drain and the gate of the first NMOS being coupled to the gate and the drain of the first PMOS respectively; and a second NMOS, the drain, the source, and the gate of the second NMOS being coupled to the source of the first NMOS, a ground terminal, and the input terminal respectively.

15. The apparatus according to claim 8, wherein the voltage step-up detecting means comprises:

a first NMOS, the source of the first NMOS being coupled to a ground terminal, and the gate of the first NMOS being used for receiving the inverted control signal; and a second NMOS, the source of the second NMOS being coupled to the drain of the first NMOS, the gate of the second NMOS being used for receiving the control signal, the drain of the second NMOS being used for receiving the input signal, and the source of the second NMOS being used as the output terminal of the voltage step-up detecting means.

16. The apparatus according to claim 8, wherein the voltage step-up discharging means comprises:

a first NMOS, the source, the gate, and the drain of the first NMOS being coupled to a ground terminal, the second capacitor, and the output terminal of the apparatus respectively, the first PMOS being used for discharging the output terminal of the apparatus in response to an increase in the voltage of the gate of the first NMOS; and a second NMOS, the source, the drain, and the gate of the second NMOS being coupled to the ground terminal, the second capacitor, the output terminal of the inverter respectively, the second NMOS being used for charging the gate of the first NMOS according to the inverted control signal.

17. The apparatus according to claim 16, wherein the second accelerating means is a positive feedback charging loop for charging the voltage step-up discharging means.

18. The apparatus according to claim 17, wherein the positive feedback charging loop comprises:

a first PMOS, the drain and the gate of the first PMOS being coupled to the gate and the drain of the first NMOS respectively; and a second PMOS, the drain, the source, and the gate of the second PMOS being coupled to the source of the first PMOS, a power terminal, and the input terminal of the apparatus respectively.

19. An apparatus for capacitor-coupling acceleration, for use in an interconnect line to accelerate signal transitions of a digital signal, the apparatus comprising:

voltage step-down detecting means, coupled to the interconnect line and having an output terminal, for detecting a slow decrease in the voltage level of the digital signal so as to output a step-down signal, corresponding to the slow decrease, at the output terminal of the voltage step-down detecting means;

a first capacitor, coupled to the output terminal of the voltage step-down detecting means, for passing the step-down signal;

a discharging device, coupled to the interconnect line, for discharging the interconnect line;

voltage step-down charging means, coupled to the first capacitor and the discharging device, for receiving the step-down signal passed by the first capacitor so as to charge the discharging device and enable the discharging device to discharge the interconnect line;

a first accelerating means, coupled to the voltage step-down charging means, for enabling the voltage step-down charging means to charge the discharging device at an increased charging speed;

voltage step-up detecting means, coupled to the interconnect line and having an output terminal, for detecting a slow increase in the voltage level of the digital signal so as to output a step-up signal, corresponding to the slow increase, at the output terminal of the voltage step-up detecting means;

a second capacitor, coupled to the output terminal of the voltage step-up detecting means, for passing the step-up signal;

a charging device, coupled to the interconnect line, for charging the interconnect line;

voltage step-up discharging means, coupled to the second capacitor and the charging device, for receiving the step-up signal passed by the second capacitor so as to discharge the charging device and enable the charging device to charge the interconnect line; and a second accelerating means, coupled to the voltage step-up discharging means, for enabling the voltage step-up discharging means to discharge the charging device at an increased discharging speed.

20. The apparatus according to claim 19, further comprising:

high-threshold triggering means, coupled to the interconnect line and having an output terminal, for delaying the digital signal so as to output a control signal at the output terminal of the high-threshold triggering means; and an inverter, coupled to the output terminal of the high-threshold triggering means, for outputting an inverted control signal according to the control signal, wherein the control signal and the inverted control signal are used for pre-determining operating modes for the voltage step-down detecting means, the voltage step-down charging means, the voltage step-up detecting means, and the voltage step-up discharging means.

21. The apparatus according to claim 19, wherein the first accelerating means is a positive feedback discharging loop for discharging the voltage step-down charging means.

22. The apparatus according to claim 19, wherein the second accelerating means is a positive feedback charging loop for charging the voltage step-up discharging means.

23. The apparatus according to claim 20, wherein the voltage step-down detecting means comprises:

a first PMOS, the source of the first PMOS being coupled to a power terminal, and the gate of the first PMOS being used for receiving the inverted control signal; and a second PMOS, the source of the second PMOS being coupled to the drain of the first PMOS, the gate of the second PMOS being used for receiving the control signal, the drain of the second PMOS being coupled to the interconnect line and used for receiving the digital signal, and the source of the second PMOS being used as the output terminal of the voltage step-down detecting means.

24. The apparatus according to claim 20, wherein the voltage step-down charging means comprises:

a first PMOS, the source, the gate, and the drain of the first PMOS being coupled to a power terminal, the first capacitor, and the discharging device respectively, the first PMOS being used for charging the discharging device in response to a decrease in the voltage of the gate of the first PMOS; and a second PMOS, the source, the drain, and the gate of the second PMOS being coupled to the power terminal, the first capacitor, the output terminal of the inverter respectively, the second PMOS being used for charging the gate of the first PMOS according to the inverted control signal.

25. The apparatus according to claim 24, wherein the first accelerating means is a positive feedback discharging loop for discharging the voltage step-down charging means.

26. The apparatus according to claim 25, wherein the positive feedback discharging loop comprises:

a first NMOS, the drain and the gate of the first NMOS being coupled to the gate and the drain of the first PMOS respectively; and a second NMOS, the drain, the source, and the gate of the second NMOS being coupled to the source of the first NMOS, a ground terminal, and the interconnect line respectively.

27. The apparatus according to claim 20, wherein the voltage step-up detecting means comprises:

a first NMOS, the source of the first NMOS being coupled to a ground terminal, and the gate of the first NMOS being used for receiving the inverted control signal; and a second NMOS, the source of the second NMOS being coupled to the drain of the first NMOS, the gate of the second NMOS being used for receiving the control signal, the drain of the second NMOS being coupled to the interconnect line and used for receiving the digital signal, and the source of the second NMOS being used as the output terminal of the voltage step-up detecting means.

28. The apparatus according to claim 20, wherein the voltage step-up discharging means comprises:
- a first NMOS, the source, the gate, and the drain of the first NMOS being coupled to a ground terminal, the second capacitor, and the charging device respectively, the first PMOS being used for discharging the charging device in response to an increase in the voltage of the gate of the first NMOS; and
- a second NMOS, the source, the drain, and the gate of the second NMOS being coupled to the ground terminal, the second capacitor, the output terminal of the inverter respectively, the second NMOS being used for discharging the gate of the first NMOS according to the inverted control signal.

29. The apparatus according to claim 28, wherein the second accelerating means is a positive feedback charging loop for charging the voltage step-up discharging means.

30. The apparatus according to claim 29, wherein the positive feedback charging loop comprises:
- a first PMOS, the drain and the gate of the first PMOS being coupled to the gate and the drain of the first NMOS respectively; and
- a second PMOS, the drain, the source, and the gate of the second PMOS being coupled to the source of the first PMOS, a power terminal, and the interconnect line respectively.

31. The apparatus according to claim 19, wherein the discharging device is an NMOS, the source, the drain, and the gate of the NMOS are coupled to a ground terminal, the interconnect line, and the voltage step-down charging means respectively.

32. The apparatus according to claim 19, wherein the charging device is a PMOS, while the source, the drain, and the gate of the PMOS are coupled to a power terminal, the interconnect line, and the voltage step-up discharging means respectively.

33. The apparatus according to claim 20, wherein the high-threshold triggering means is a high-threshold capacitor-coupling triggering device.

* * * * *